US006809511B2

United States Patent
Akama

(10) Patent No.: US 6,809,511 B2
(45) Date of Patent: Oct. 26, 2004

(54) DEVICE POWER SUPPLY AND IC TEST APPARATUS

(75) Inventor: Hideo Akama, Tokyo (JP)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 10/154,503

(22) Filed: May 23, 2002

(65) Prior Publication Data

US 2002/0180478 A1 Dec. 5, 2002

(30) Foreign Application Priority Data

May 31, 2001 (JP) ......................................... 2001-165413

(51) Int. Cl.[7] ............................. G01R 31/28; G05F 1/40
(52) U.S. Cl. ..................... 324/158.1; 323/273; 324/765
(58) Field of Search ............................... 324/765, 158.1; 330/109; 323/273, 279, 293

(56) References Cited

U.S. PATENT DOCUMENTS 4,189,681 A * 2/1980 Lawson et al. .............. 330/109
6,359,459 B1 * 3/2002 Yoon et al. .................. 324/765

FOREIGN PATENT DOCUMENTS

JP          58121812        7/1983

* cited by examiner

Primary Examiner—Ernest Karlsen

(57) ABSTRACT

A device power supply includes an amplifier, a high output-side force terminal connected to the output of the amplifier, a high-output side sense terminal, and a first feedback circuit from the high output-side sense terminal to the input of the amplifier, where there is a first low-pass filter in between the amplifier output and the first feedback circuit.

6 Claims, 2 Drawing Sheets

DEVICE POWER SUPPLY AND IC TEST APPARATUS

BACKGROUND OF THE INVENTION

1. Field of the Invention

The present invention pertains to an IC test apparatus (IC tester) and a device power supply used in the test apparatus, and in further detail, to a power supply referred to as an SMU (Source Measure Unit) or DPS (Device Power Supply) that applies voltage and current to and performs measurement on an IC, and a test apparatus that uses the power supply.

2. Discussion of the Background Art

The SMU as shown in Japanese Laid-Open Patent No. Sho 58-121812 has been used in the past as a device power supply for the IC of an IC test apparatus, such as IC testers and DC parametric test systems, etc. By using the SMU, it has been possible to perform function tests on applying voltage to the terminal of the IC while limiting current, or to measure current with applying voltage to the IC test apparatus, with a short settling time.

As shown in FIG. 1, device power supply 10 having a negative feedback amplifier according to the prior art, for instance, includes input resistor R2 14, amplifier A1 16, current detection resistor R3 18, inductances L1 20, L2 21, and L3 25, load impedance Z1 22, buffer B1 26, feedback resistor R1 28, capacitor C1 30, input terminal 12 and its voltage $V_{In}$, force terminal 52 on the high output-side of the apparatus, sense terminal 54 on the high output-side of the apparatus, and DUT terminal 24 and its voltage $V_{out}$. Load impedance Z1 22 here includes impedances such as the capacitive components of the termination resistor and by-pass capacitor, capacitive and/or inductive components of filter circuit for eliminating noise, and the impedance of the device under test (DUT). Buffer B1 26 monitors and buffers the voltage $V_{out}$ of DUT terminal 24. Inductance L1 20 is an inductance due to the extended cable from one end of R3 18, connected to inductance L1 20, in the cage of the IC test apparatus on which device power supply 10 is set up, to force terminal 52 on the high output-side of the test head where the DUT is put on. And similarly, inductance L3 25 is an inductance due to the extended cable from the sense terminal on the high output-side of the test head, to buffer B1 26 inside the cage. L2 21 is the inductive component of the filter that has been connected for noise elimination. The output of amplifier A1 16 is connected to force terminal 52 on the high output-side with R3 18 and L1 20 in between. Sense terminal 54 on the high output-side is connected to the inverting input of A1 16 with L3 25, B1 26, and R1 28 in between and makes up part of the negative feedback loop. Force terminals and sense terminals are similarly set up on the low output-side of device power supply 10 in the case of full Kelvin connection (four-terminal connection), but in order to simplify the description, only the grounded terminals are shown in FIG. 1 and the details are omitted.

Voltage $V_{in}$ in conjunction with the setting voltage is applied to input terminal 12. Input terminal 12 is connected to the inverting input of amplifier A1 16 and therefore, a feedback amplifier is made by the path A1-R3-L1-terminal 52-L2-terminal 24-terminal 54-L3-B1-R1-R2 and the voltage represented by $V_{out}=-R1/R2*V_{in}$ is output to DUT terminal 24.

Suppose that there is no inductance L1, L2, or L3 in the cable and the filter circuit as an ideal case in order to consider the transfer characteristics of the entire loop. in the case, it is supposed that load Z1 is consisted of pure resistive component. There is no phase delay and gain is a value between 0 and 1 in the transfer characteristics from R3 and Z1. Since a circuit consisting of L3, B1, R1, R2, C1 and A1 make an integrator, the phase delay of their transfer characteristics is 90 degrees. Consequently, the phase delay of the overall transfer characteristics is a maximum of 90 degrees and therefore, the transfer characteristics of the total feedback loop are stable, regardless of the gain of the integrator.

Nevertheless, in actual measurements, if a large current of one ampere (A) or greater is applied to the DUT, very small resistance is used in order to reduce the voltage drop at resistor R3 18. Sometimes, inductance L1 and L3 due to the extended cable become to be relatively large. An L-C filter can be added in order to reduce various types of noise and therefore, inductance of the L-C filter is added to inductance L2 21. Accordingly, the capacitive component of the L-C filter (referred to as Cz) and the capacitive component of the by-pass capacitor are included in Z1 22.

In this case, R3-L1-L2-Z1 becomes the secondary resonant circuit of L-R-C. Moreover, as previously mentioned, since R3 is small, the quality factor of the secondary resonant circuit is high. As a result, the phase delay of the transfer characteristics from the output of amplifier A1 16 to DUT terminal 24 has a maximum angle of 180 degrees (when R3 is 0 Ω.). However, in normal cases, R3 is not at 0 Ω and therefore, it becomes 140 degrees for instance.

Next, the transfer characteristics from DUT terminal 24 to the output of buffer B1 26 will be considered. The effects of inductance L3 25 can be disregarded because the input impedance of buffer B1 26 is high and therefore, as in the case where there is no inductance L3 25, the transfer characteristics become a gain of 1 and a phase delay of 0 degrees. The transfer characteristics from the output of buffer B1 26 to the output of amplifier A1 16 become integration characteristics and the phase delay becomes 90 degrees.

As a result, the phase delay angle of overall transfer characteristics is a maximum of 270 degrees (when R3 is 0 Ω). And if the gain of the overall transfer characteristics become 0 dB or higher at the frequency where phase delay is over 180 degrees, oscillation will occur. However, in most cases, R3 is not 0 Ω and the phase delay becomes smaller than 180 degrees, therefore, oscillation does not occur, but ringing can occur because of the less phase margin.

As previously mentioned, there are problems with conventional device power supplies in that oscillation or ringing readily occurs, when the capacitive component of load Z1 is large. Once oscillation or ringing have occurred, a higher voltage than the maximum allowable voltage can be applied to the power source terminals of the device, then, the device itself will be damaged. The device can also break down. Moreover, as a result of the ringing, etc., a good device can also be evaluated as a defective one.

Furthermore, the power current has increased with the recent increase in speed and reduction in operating voltage of the IC and therefore, resistance R3 18 tends to be lower. Therefore, it becomes necessary to prevent oscillation and ringing of device power supplies.

SUMMARY OF THE INVENTION

In light of these problems of the prior art, the present invention provides a device power supply and IC test apparatus with which there is little oscillation, even if the load capacitive component is large, with the short stabilizing time remaining uncompromised to the utmost during IC tests.

The present invention presents a device power supply, having an amplifier, a high output-side force terminal connected to the output of the amplifier, a high output-side sense terminal, and a first feedback circuit from the high output-side sense terminal to the input of the amplifier, where a first low-pass filter is placed between the amplifier output and the first feedback circuit. Moreover, there is a first inductance between the first low-pass filter and the high output-side force terminal. By means of this type of structure, oscillations rarely occur, even under a load with a large volume component.

Moreover, the first low-pass filter can have a capacitor that connects the amplifier output and the first feedback circuit and a resistor inserted in series between the capacitor connection terminal of the first feedback circuit and the high output-side sense terminal. And it can have a resistor and capacitor connected in series, which connect the amplifier output and the first feedback circuit and a resistor connected in series that connect the connection terminal of the capacitor for the first feedback circuit and the high output-side sense terminal.

Furthermore, in the case of full Kelvin connection, the first feedback circuit is connected to the inverting input of the amplifier. The device power supply further has a low output-side force terminal and a low output-side sense terminal. The low output-side force terminal is grounded with a second inductance in between, the low output-side sense terminal is connected to the non-inverting input of the amplifier with a second feedback circuit in between, and the terminal on the grounded side of the second feedback circuit and the second inductance have a second low-pass filter.

Moreover, the IC test apparatus of the present invention comprises an amplifier, a load impedance connected to the output of the amplifier, and a feedback circuit from the load impedance to the input of the amplifier, and there is a first low-pass filter between the amplifier output and feedback circuit.

Moreover, the feedback circuit of this IC test apparatus is connected to the inverting input of the amplifier, and the terminal where the load impedance is not connected to the output of the amplifier can be connected to the inverting input of the amplifier with the second low-pass filter and the second inductance in between.

Furthermore, low-pass filters can be implemented by a primary low-pass filter, or a higher order, such as a secondary or higher, low-pass filter.

As previously mentioned, when the present invention is used, it is possible to present a device power supply for an IC test apparatus with which there is hardly any oscillation, even if the capacitive component of the load is large or if various power source filters have been introduced. As a result, a device power supply can be presented with which there is hardly any oscillation, the settling time is short, and the noise is low.

DETAILED DESCRIPTION OF THE INVENTION

Figure 1:
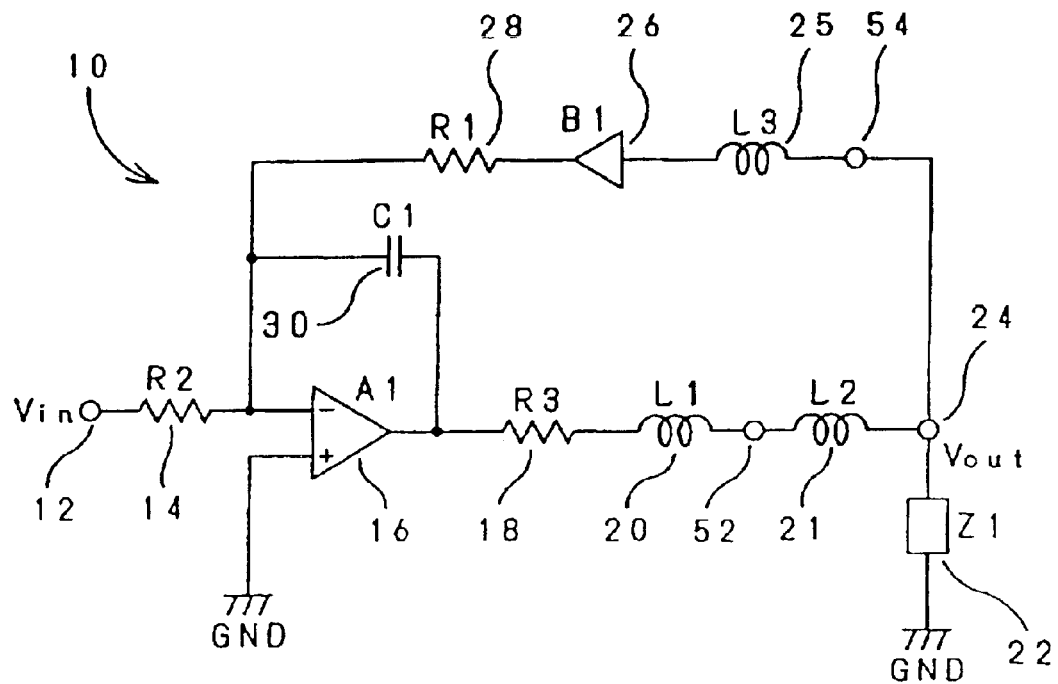
FIG. 1 is a schematic drawing showing a device power supply according to the prior art.
Figure 2:
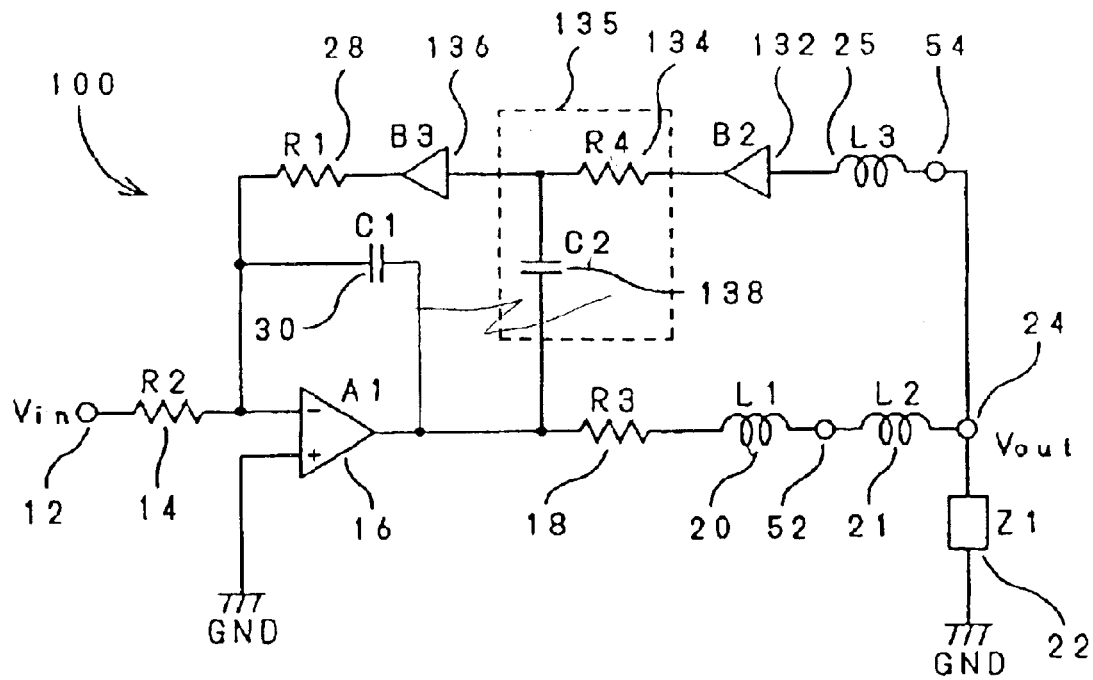
FIG. 2 is a schematic drawing showing the device power supply of the first embodiment of the present invention.

FIG. 2 shows a schematic diagram of device power supply 100 of the first embodiment according to the present invention. It is noted that each component having the same reference number in FIGS. 1–4 is the same component referred to the same reference number in the former figure.

In FIG. 2, in contrast to the prior art, 2 groups of circuits, each comprised of a resistor and a buffer (resistor R1 28, buffer B3 136, resistor R4 134, buffer B2 132) were set up in the feedback loop path from load impedance Z1 22 to the inverting input of amplifier A1 16, and the junction of resistor R4 134 and buffer B3 136 of the feedback loop are connected by capacitor C2 138 with the output of amplifier A1 16. Buffer B3 and/or B2 can be omitted, if the enough current is supplied to resistor R1 and/or R4.

For instance, it is possible to set R3 18 at 40 mΩ, L1 20 at 1 µH, L2 at 100 mH–1 µH, the capacitive component of Z1 22 at 1 nF–1 mF, and the time constant C2×R4 of C2 138 and R4 134 at approximately 20 µsec.

Accordingly, low-pass filter 135 is made from resistor R4 134 and capacitor C2 138, therefore, the phase can be reduced to 90 degrees for instance. Hence, the overall phase delay is reduced to 140–180 degrees. As a result, the phase margin of the loop will increase and it will become stable against oscillations.

Figure 3:
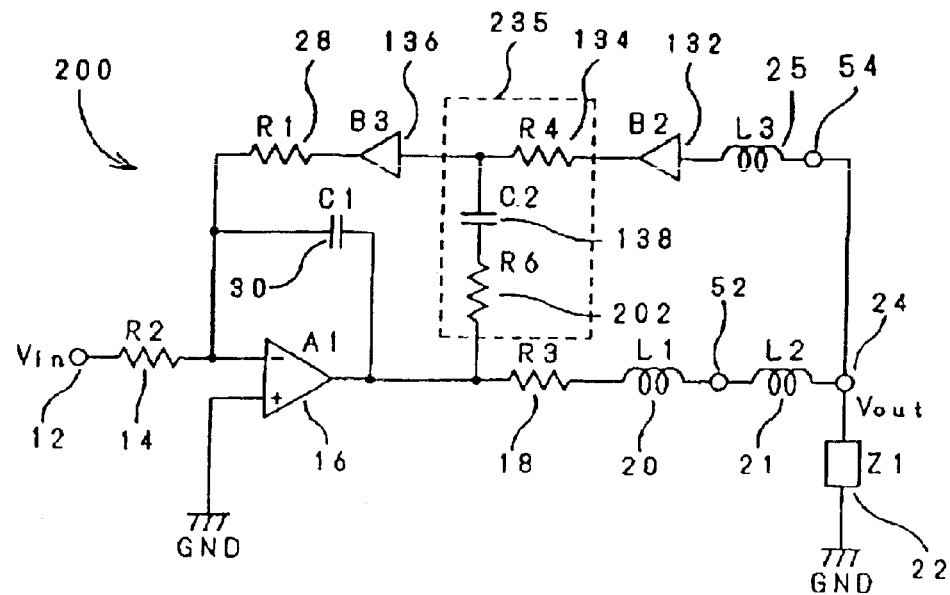
FIG. 3 is a schematic drawing showing the device power supply of the second embodiment of the present invention.

Next, the second embodiment according to the present invention is shown as device power supply 200 in FIG. 3. It is different from the first embodiment in that resistor R6 202 is provided in between the output of amplifier A1 16 and capacitor C2 138. Low-pass filter 235 is made by R4, C2 and R6 and the phase delay can be improved only by the necessary frequency band. For instance, the settling speed can be increased by reducing the phase delay at only the resonance frequency range of circuit R3-L1-L2-Z1 and by reducing the current to capacitor C2 138 at high frequency.

Figure 4:
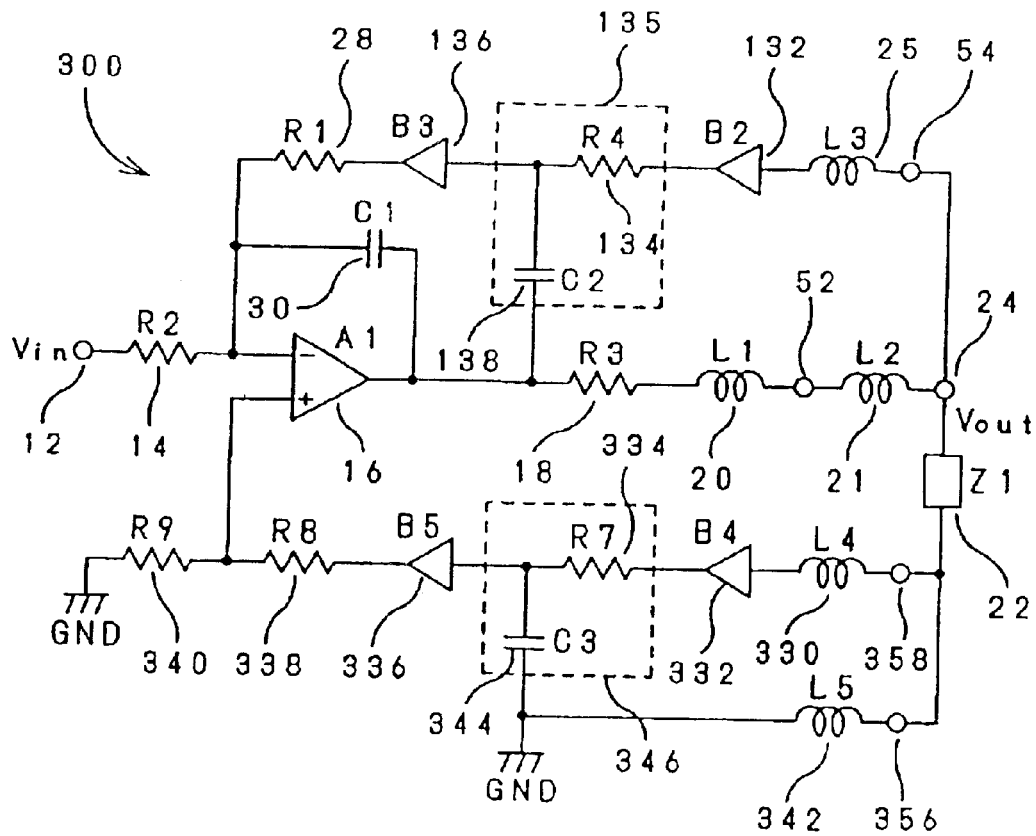
FIG. 4 is a schematic drawing showing the device power supply of the third embodiment of the present invention.

The third embodiment according to the present invention is shown as device power supply 300 in FIG. 4. The case in which the full Kelvin connection is applied to the first embodiment is shown here. Device power supply 300 has low output-side sense terminal 358 and low output-side force terminal 356 and is connected to the terminal on the grounded side of load impedance Z1 22. Low output-side sense terminal 358 forms a separate feedback loop by being connected to the non-inverting input of amplifier A1 16 with inductance L4 330, buffer B4 332, resistor R7 334, buffer B5 336, and resistor R8 338 in between, where inductance L4 includes inductance in the extension cable from sense terminal 358 of the test head to the cage. The non-inverting input of amplifier A1 16 is also grounded with resistor R9 340 in between. Low output-side force terminal 356 is grounded with inductance L5 342 in between, which is included in the extended cable from force terminal 356 of the test head to the cage. Capacitor C3 344 is connected between R7 334 and B5 336 and the terminal on the grounded side of L5 342. Low-pass filter 346 is made by R7 334 and C3 344, which provides the same effect as low-pass filter 135 in FIG. 2.

It is noted that an inverting-type amplifier is used in the above embodiments with exemplary purpose only. It should be easily understood by those skilled in the art that a non-inverting-type amplifier can also be used instead of an inverting-type amplifier in the above-mentioned embodiments of the present invention.

Furthermore, low-pass filters 135, 235, and 346 in FIGS. 2 through 4 which are represented as a primary low-pass filter can also be possible to be replaced by a higher order, such as a secondary or higher, low-pass filter.

In addition, one end of C2 138 was connected to the output of amplifier A1 16 in FIG. 2, in the above explanation. However, the end of C2 138 may be connected not to the output of amplifier A1 16 but to an internal point of amplifier where the voltage of the point varies similarly to that of the output of the amplifier A1 16. For instance, when amplifier A1 has an output stage including emitter-follower transistor circuit, it can be connected not to the emitter but the base of the transistor. Furthermore, the end of C2 138 can also be grounded. In this case, there happens to be a time delay because of charging C2 138 when a predetermined voltage is applied.

As previously mentioned, when the present invention is used, it is possible to present a device power supply for an IC test apparatus with which there is hardly any oscillation, even if the capacitive component of the load is large or if various power source filters have been introduced. As a result, a device power supply can be presented with which there is hardly any oscillation, the settling time is short, and the noise is low.

I claim:

1. A device power supply comprising:

an amplifier;

a high output-side force terminal connected to an out of said amplifier for connecting to a load impedance;

a high output-side sense terminal for connecting to said load impedance, said high output-side sense terminal provided in a first feedback loop from said load impedance to an input of said amplifier; and a first low-pass filter for said first feedback loop comprising a first terminal connected to said high output-side sense terminal, a second terminal connected to said input of said amplifier, and a third terminal connected to said output of said amplifier.

2. The device power supply in claim 1, further comprising a first inductance between said output of said amplifier and said high output-side force terminal.

3. The device power supply in claim 1, wherein said first low-pass filter comprises a capacitor connected between said second and third terminals of said first low-pass filters and a resistor connected between said first and second terminals of said first low-pass filter.

4. The device power supply in claim 1, wherein said first low-pass filter has a resistor and capacitor connected in series, which connect said amplifier output and said first feedback circuit and a resistor inserted in series between the connection terminal of said capacitor for said first feedback circuit and said high output-side sense terminal.

5. The device power supply in claim 1, wherein said first feedback circuit is connected to the inverting input of said amplifier, and said device power supply has a low output-side force terminal and a low output-side sense terminal, said low output-side force terminal is grounded with a second inductance in between, said low output-side sense terminal is connected to the non-inverting input of said amplifier with a second feedback circuit in between, and the terminal on the grounded side of said second feedback circuit and said second inductance have a second low-pass filter.

6. The device power supply in claim 3, further comprising a buffer connected between said high output-side sense terminal and said first terminal of said first low-pass filter for monitoring a voltage of said load impedance.

* * * * *